United States Patent
Durlam et al.

(10) Patent No.: US 6,518,071 B1
(45) Date of Patent: Feb. 11, 2003

(54) MAGNETORESISTIVE RANDOM ACCESS MEMORY DEVICE AND METHOD OF FABRICATION THEREOF

(75) Inventors: Mark A. Durlam, Chandler, AZ (US);
Mark F. Deherrera, Tempe, AZ (US);
Kelly W. Kyler, Mesa, AZ (US); Brian R. Butcher, Gilbert, AZ (US); Gregory W. Grynkewich, Gilbert, AZ (US);
Steven M. Smith, Gilbert, AZ (US);
Charles Snyder, Gilbert, AZ (US); Jon M. Slaughter, Tempe, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/109,429

(22) Filed: Mar. 28, 2002

(51) Int. Cl.$^7$ .............................................. H01L 21/00
(52) U.S. Cl. ............................................ 438/3; 438/43
(58) Field of Search .............................. 438/3, 42, 43, 438/197, 221, 259, 263, 264, 381, 435, 689, 700, 706, 745

(56) References Cited

U.S. PATENT DOCUMENTS 5,569,617 A  * 10/1996  Yeh et al. ....................... 438/3
5,699,293 A  * 12/1997  Tehrani et al. ............... 365/158
6,392,924 B1 *  5/2002  Liu et al. ..................... 365/158

* cited by examiner

Primary Examiner—David Nelms
Assistant Examiner—David Nhu
(74) Attorney, Agent, or Firm—William E. Koch

(57) ABSTRACT

A method of fabricating a MRAM device with a taper comprising the steps of providing a substrate, forming a dielectric region with positioned on the substrate, patterning and isotropically etching through the dielectric region to the substrate to form a trench, depositing the MRAM device within the trench wherein the MRAM device includes a first ferromagnetic region with a width positioned on the substrate, a non-ferromagnetic spacer layer with a width positioned on the first ferromagnetic region, and a second ferromagnetic region with a width positioned on the non-ferromagnetic spacer layer wherein the taper is formed by making the width of the first ferromagnetic region greater than the width of the non-ferromagnetic spacer layer, and the width of the non-ferromagnetic spacer layer greater than the width of the second ferromagnetic region so that the first ferromagnetic region is separated from the second ferromagnetic region.

44 Claims, 5 Drawing Sheets

MAGNETORESISTIVE RANDOM ACCESS MEMORY DEVICE AND METHOD OF FABRICATION THEREOF

FIELD OF THE INVENTION

This invention relates to semiconductor memory devices.

More particularly, the present invention relates to improved methods of fabricating semiconductor random access memory devices that utilize a magnetic field.

BACKGROUND OF THE INVENTION

A magnetoresistive random access memory (hereinafter referred to as "MRAM") device has a structure which includes ferromagnetic layers separated by a non-ferromagnetic layer. Information is stored as directions of magnetization vectors in magnetic layers. Magnetic vectors in one magnetic layer, for instance, are magnetically fixed or pinned, while the magnetization direction of the other magnetic layer is free to switch between the same and opposite directions as information which are called "Parallel" and "Anti-parallel" states, respectively. In response to Parallel and Anti-parallel states, the magnetic memory element represents two different resistances. The resistance indicates minimum and maximum values when the magnetization vectors of two magnetic layers point in substantially the same and opposite directions, respectively. Accordingly, a detection of changes in resistance allows an MRAM device to provide information stored in the magnetic memory element.

A MRAM device integrates magnetic memory elements and other circuits, for example, a control circuit for magnetic memory elements, comparators, for detecting states in a magnetic memory element, input/output circuits, etc. These circuits are fabricated in the process of complimentary metal oxide semiconductor (hereinafter referred to as "CMOS") technology in order to lower the power consumption of the MRAM device. The CMOS process requires high temperature steps which exceeds 300° C. for depositing dielectric and metal layers and annealing implants, for example.

Magnetic layers employ ferromagnetic materials such as cobalt-iron (Co—Fe) and nickel-iron-cobalt (NiFeCo) which require processing below 300° C. in order to prevent intermixing of magnetic materials caused by high temperatures. Accordingly, magnetic memory elements need to be fabricated at a different stage after CMOS processing.

Further, magnetic memory elements contain components that are easily oxidized and also sensitive to corrosion. To protect magnetic memory elements from degradation and keep the performance and reliability of the MRAM device, a passivation layer is formed over magnetic memory elements.

In addition, the performance of the magnetic memory element is sensitive to the surface conditions on which magnetic layers are deposited. A magnetic memory element includes very thin layers, some of which are tens of angstroms thick, which can lead to shorting through the tunneling junction. Accordingly, it is necessary to make a flat surface to prevent the characteristics of the MRAM device from degrading. Also, magnetic memory elements are typically very small which makes it extremely difficult to connect the magnetic memory element to circuitry by using photolithography processes where the alignment tolerances are tight. Further, the materials comprising the ferromagnetic layers are difficult to etch because they are typically non-volatile in conventional low temperature plasmas and are very thin which makes them sensitive to corrosion from conventional chlorine based chemistries.

It would be highly advantageous, therefore, to remedy the foregoing and other deficiencies inherent in the prior art.

SUMMARY OF THE INVENTION

To achieve the objects and advantages specified above and others, an improved method of fabricating a MRAM device is disclosed. The method involves providing a substrate with a surface, forming a dielectric region with a surface positioned on the substrate, patterning and isotropically etching through the dielectric region to the substrate to form a trench with a top width and a bottom width within the dielectric region, the trench including a first wherein an edge profile is formed.

A tapered MRAM device is deposited within the trench and positioned on the substrate wherein the tapered MRAM device has a surface. The MRAM device includes a first ferromagnetic region with a width and a thickness positioned on the substrate, a non-ferromagnetic spacer layer with a width positioned on the first ferromagnetic region, and a second ferromagnetic region with a width and a thickness positioned on the non-ferromagnetic spacer layer, wherein a gap exists between the tapered MRAM device and the side of the trench.

In the preferred embodiment, the first ferromagnetic region includes a pinned synthetic anti-ferromagnetic region and the second ferromagnetic region includes a free ferromagnetic region. Further, the non-ferromagnetic spacer layer forms a tunneling junction between the first ferromagnetic region and the second ferromagnetic region.

The tapered MRAM device is deposited wherein the taper is formed by making the width of the first ferromagnetic region substantially greater than the width of the non-ferromagnetic spacer layer, and the width of the non-ferromagnetic spacer layer substantially greater than the width of the second ferromagnetic region. This is accomplished by controlling the edge profile of the trench.

In the preferred embodiment, the edge profile on the side of the trench forms an undercut gap on the side of the trench wherein the bottom width of the trench is substantially greater than the top width. This feature causes the width of the trench to decrease as the MRAM device is deposited wherein the width of each subsequently deposited layer within the trench is formed with a shorter width than the previously deposited layer. Hence, the MRAM device is formed with a taper, which decreases the likelihood of a shorting current from flowing directly between the free and pinned ferromagnetic regions and, consequently, increases the device yield. Also, the presence of a shorting current can be minimized by surrounding the MRAM device with an oxide or by oxidizing a portion of the MRAM device. An advantage of this method is the elimination of etching steps that utilize corrosive elements, such as chlorine (Cl), which can damage the thin magnetic layers typically used in an MRAM device.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings.

DETAILED DESCRIPTION OF THE PREFERRED EMBODIMENT

Figure 1:
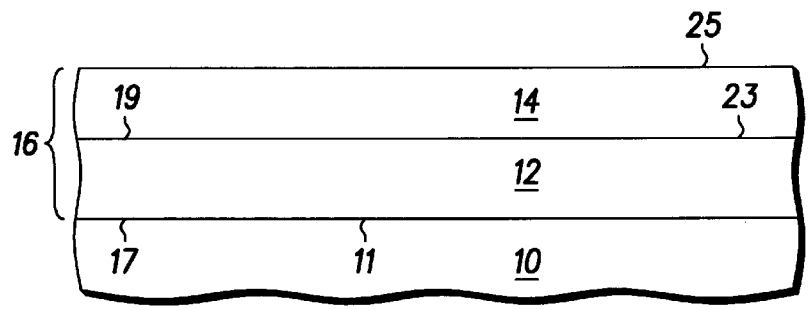
FIGS. 1 through 7 are simplified cross-sectional views illustrating several steps in a method of fabricating a MRAM device with a taper in accordance with the present invention wherein N is equal to two.

Referring specifically to FIG. 1, a cross-sectional view of a partially fabricated MRAM cell 5 is illustrated. A substrate 10 with a surface 11 is provided whereon a dielectric region 16 is formed. Substrate 10 can include a conductive layer, such as copper (Cu) or another suitable conductive material. Dielectric region 16 can include silicon oxide ($SiO_2$), silicon nitride ($Si_3N_4$), or other suitable dielectric materials. Also, dielectric region 16 can include N dielectric layers, wherein N is a whole number greater than or equal to one. In the preferred embodiment, N is equal to two wherein dielectric region 16 includes a dielectric layer 12 with a bottom 17 and a top 19, with layer 12 being positioned on substrate 10 and a dielectric layer 14 with a bottom 23 and top 25, with layer 14 being positioned on dielectric layer 14. Further, it will be understood that each adjacent dielectric layer included in dielectric region 16 has a different etch property, as will be discussed presently.

Figure 2:
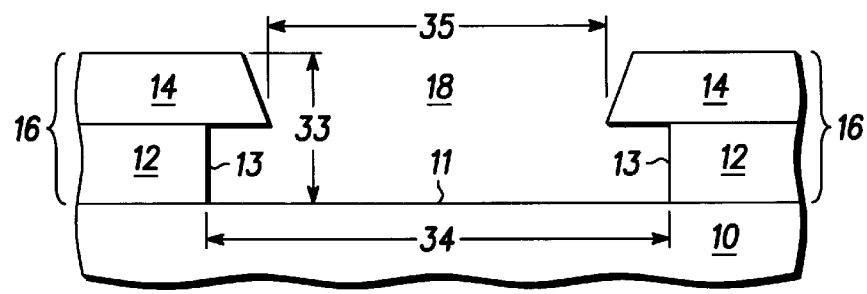

Turning now to FIG. 2, dielectric region 16 is patterned and isotropically etched through dielectric region 16 to substrate 10 to form a trench 18 with a depth 33, a top width 35, and a bottom width 34 within dielectric region 16. Further, trench 18 is an opening that defines the physical limits of MRAM cell 5. Trench 18 has a shape which may be, for example, round, elliptical, rectangular, etc. (side 13 appears as two opposed sides in the cross-sectional views) wherein an undercut gap is formed by the isotropic etch proximate to side 13. The purpose of the undercut gap will be discussed presently.

Figure 3:
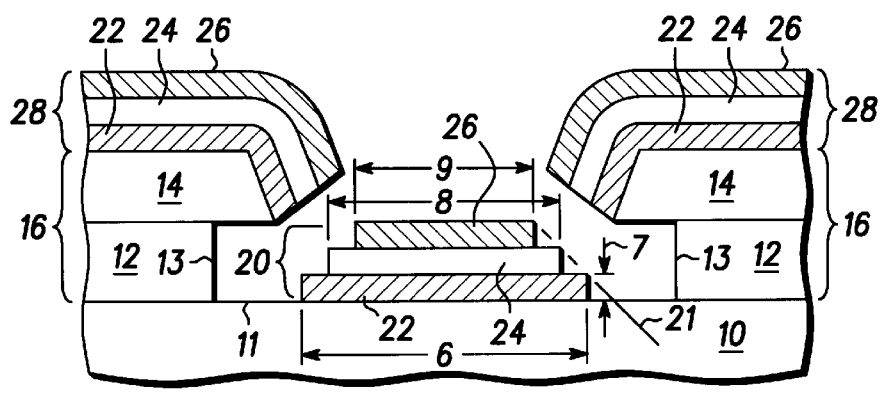

Turning now to FIG. 3, a MRAM device 20 is deposited within trench 18 and positioned on substrate 10. Further, MRAM device 20 includes a ferromagnetic region 22 with a width, designated 6, and a thickness, designated 7, positioned on substrate 10, a non-ferromagnetic spacer layer 24 with a width, designated 8, positioned on ferromagnetic region 22, and a ferromagnetic region 26 with a width, designated 9, positioned on non-ferromagnetic spacer layer 24. In the preferred embodiment, ferromagnetic region 22 includes a pinned synthetic anti-ferromagnetic region and ferromagnetic region 26 includes a free ferromagnetic region. The pinned and free regions can be briefly explained in that generally, the free ferromagnetic region has a magnetic moment which is free to rotate in a certain applied magnetic field while the magnetic moment of layer 22 remains substantially fixed in that applied field. Further, non-ferromagnetic spacer layer 24 forms a tunneling junction between ferromagnetic regions 22 and 26. It will be understood that ferromagnetic regions 22 and 26 and non-ferromagnetic spacer layer 24 can include multiple layers, but are illustrated as including one layer for simplicity.

During deposition of MRAM device 20, a blanket region 28 is formed on dielectric layer 14. Further, the undercut gap formed proximate to side 13 prevents the unwanted blanket region from being deposited on surface 11 adjacent to side 13 such that a gap exists between MRAM device 20 and side 13.

MRAM device 20 has a taper 21 which is formed by making width 6 of ferromagnetic region 22 substantially greater than width 8 of non-ferromagnetic spacer layer 24. Further, width 8 of non-ferromagnetic spacer layer 24 is substantially greater than width 9 of ferromagnetic region 26. This feature decreases the likelihood of a shorting current flowing through ferromagnetic regions 22 and 24. Further, taper 21 can be oxidized with an oxygen plasma or the like to further decrease the likelihood of a shorting current.

Taper 21 is formed by controlling the shape of trench 18. In the preferred embodiment, the width of trench 18 at bottom 17 of dielectric layer 12 is formed to be approximately equal to the width of trench 18 at top 19 of dielectric layer 12. Hence, dielectric layer 12 is a cavity-forming layer wherein MRAM device 20 is formed. Further, the width of trench 18 at bottom 23 of dielectric layer 14 is formed to be less than the width of trench 18 at bottom 17 of dielectric layer 12 wherein the undercut gap is formed proximate to side 13. The width of trench 18 at top 25 of dielectric layer 14 is formed to be greater than the width of trench 18 at bottom 23 of dielectric layer 14 such that trench 18 adjacent to dielectric layer 14 slopes inwardly to decrease the width.

Figure 4:
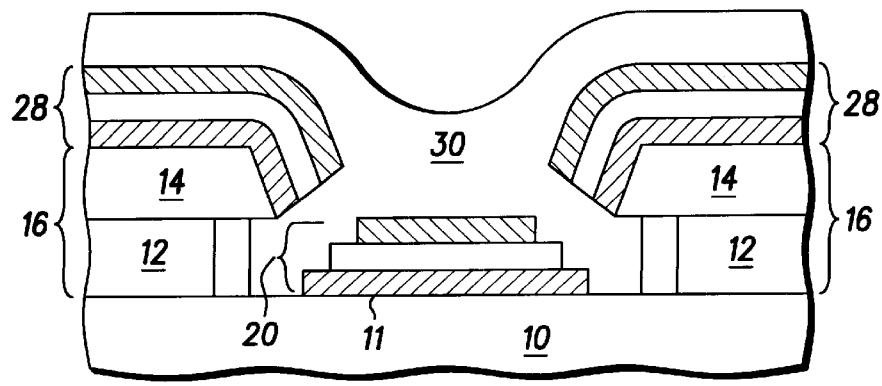
Figure 5:
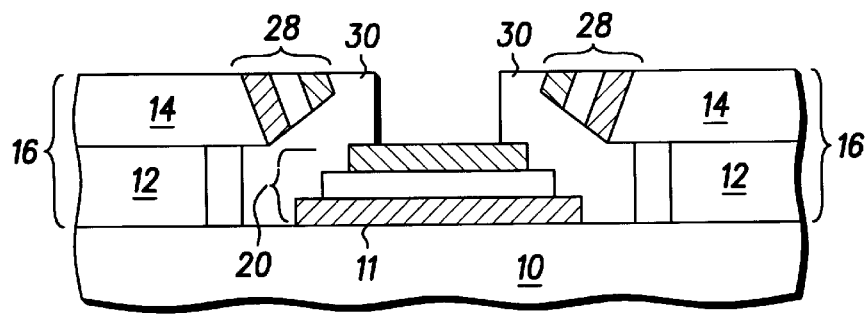
Figure 6:
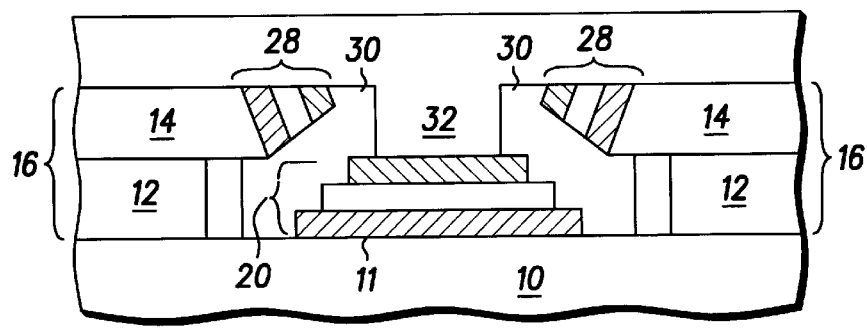
Figure 7:
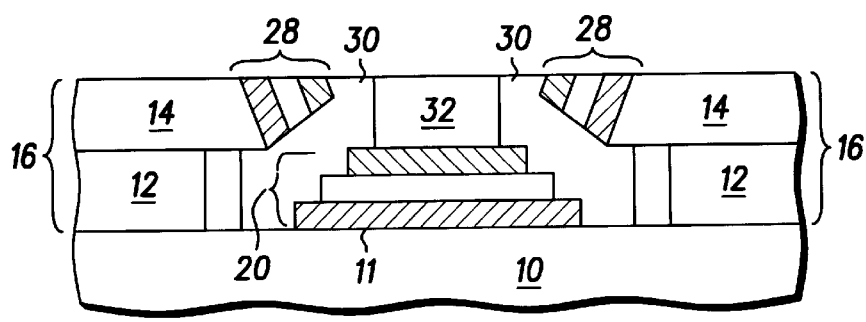

This feature causes the width of trench 18 at bottom 23 of dielectric layer 14 to decrease as MRAM device 20 is deposited wherein the width of each subsequently deposited layer 22, 24, and 26 is formed with a shorter width than the previously deposited layer. Hence, MRAM device 20 is formed with a taper 21, as illustrated in FIG. 3. In other embodiments, the thickness of ferromagnetic layer 22 can be formed to be approximately equal to the thickness of dielectric layer 12, which reduces possible shorting to layer 24. In the preferred embodiment, the undercut gap is filled with a dielectric material 30 (FIG. 4), such as silicon oxide ($SiO_2$), silicon nitride ($Si_3N_4$), or another suitable dielectric material. Dielectric material 30 is then etched so that the surface of MRAM device 20 is partially exposed, as illustrated in FIG. 5. Dielectric material 30 can be patterned and etched by methods well known to those skilled in the art (dry etching, wet etching, CMP, etc.). A conductive material 32 is deposited on MRAM cell 5 (FIG. 6) and patterned and Chemical-Mechanical-Polishing (CMP) (FIG. 7) to form a self-aligned conductive via positioned adjacent to MRAM device 20.

Figure 8:
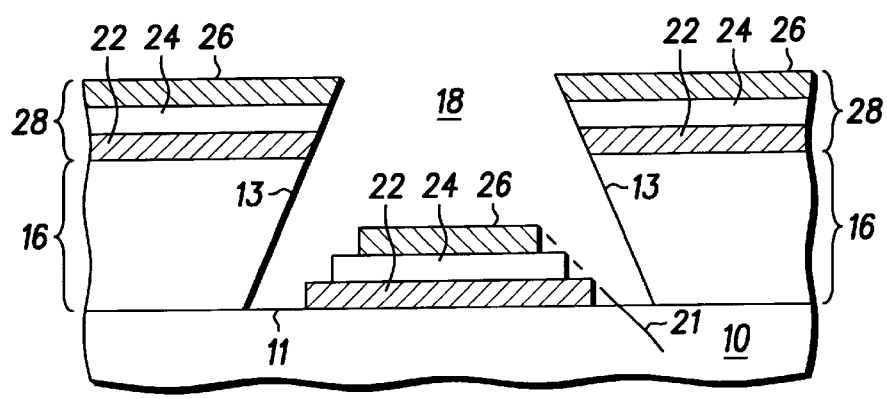
FIG. 8 is a simplified cross-sectional view illustrating a step in the method of fabricating a MRAM device with a taper in accordance with the present invention wherein N is equal to one.

In another embodiment as illustrated in FIG. 8, dielectric region 16 includes one dielectric layer (N=1) wherein the undercut gap is formed on side 13 of trench 18 by retrograde etching dielectric region 16 wherein the bottom width of trench 18 is substantially greater than the top width. In this embodiment, the undercut gap can be formed with only a single dielectric layer and a single etch step. By eliminating etch steps, the fabrication process is simplified and the cost is reduced.

Figure 9:
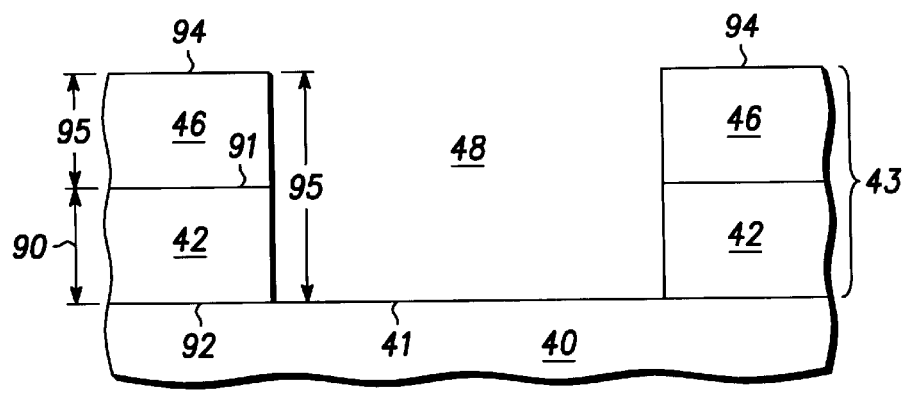
FIGS. 9 through 12 are simplified cross-sectional views illustrating several steps in another embodiment of a method of fabricating a MRAM device with a taper in accordance with the present invention wherein N is equal to four.

Turning now to FIG. 9, another embodiment of forming a MRAM cell 39 is illustrated. MRAM cell 39 includes a substrate 40 with a surface 41 having a dielectric region 43 formed thereon. It will be understood that substrate 40 can include a conductive layer, such as copper (Cu) or another suitable conductive material. In this embodiment, N is equal to two wherein dielectric region 43 includes a dielectric layer 42 with a thickness 90, a top 91, and a bottom 92 positioned on substrate 40 and wherein dielectric region 43 further includes a photoresist layer 46 with a thickness 93 and a top 94 positioned on first dielectric layer 42. Photoresist layer 46 is patterned and etched by techniques well known by those skilled in the art to form a trench 48 with a depth 95.

Figure 10:
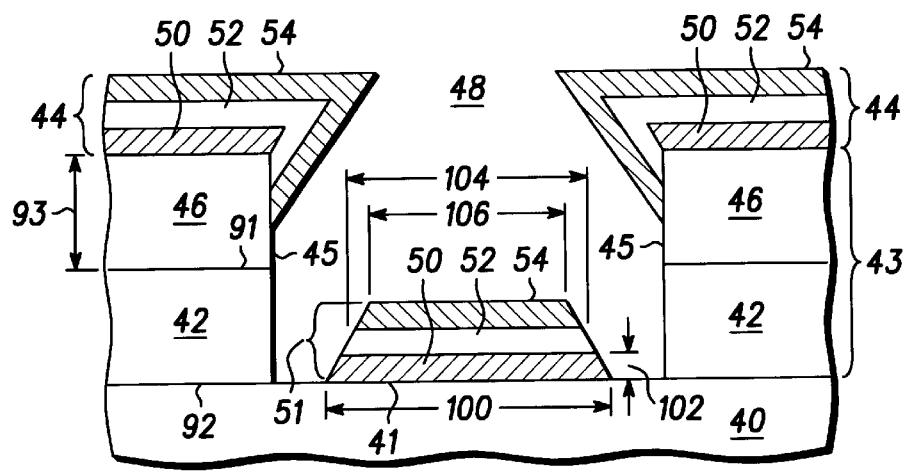

Turning now to FIG. 10, a MRAM device 51 is deposited within trench 48 and positioned on substrate 40. MRAM device 51 includes a ferromagnetic region 50 with a width 100 and a thickness 102 positioned on substrate 40, a non-ferromagnetic spacer layer 52 with a width 104 positioned on ferromagnetic region 50, and a ferromagnetic region 54 with a width 106 positioned on non-ferromagnetic spacer layer 52. In this embodiment, ferromagnetic region 50 includes a pinned synthetic anti-ferromagnetic region and ferromagnetic region 54 includes a free ferromagnetic region. Further, non-ferromagnetic spacer layer 52 forms a tunneling junction between ferromagnetic regions 50 and 54. It will be understood that ferromagnetic regions 50 and 54 and non-ferromagnetic spacer layer 52 can include multiple layers, but are illustrated as including one layer for simplicity.

Thickness 93 of photoresist layer 46 is substantially greater than thickness 90 of dielectric layer 42 so that trench 48 has a high aspect ratio that prevents MRAM device 51 from being deposited on side 45 of trench 48 proximate to bottom 92 of dielectric layer 42 and on surface 41 adjacent to side 45, as illustrated in FIG. 10.

Figure 11:
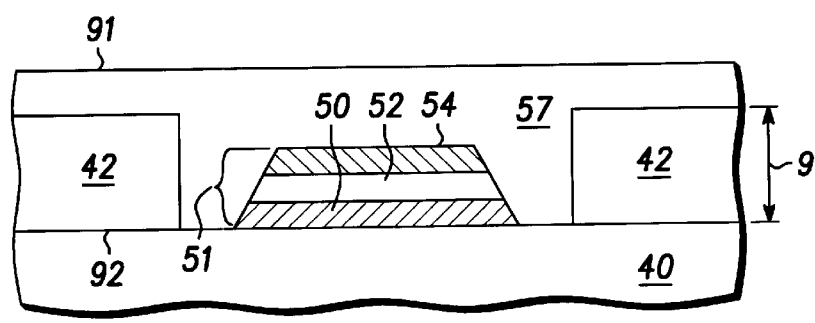
Figure 12:
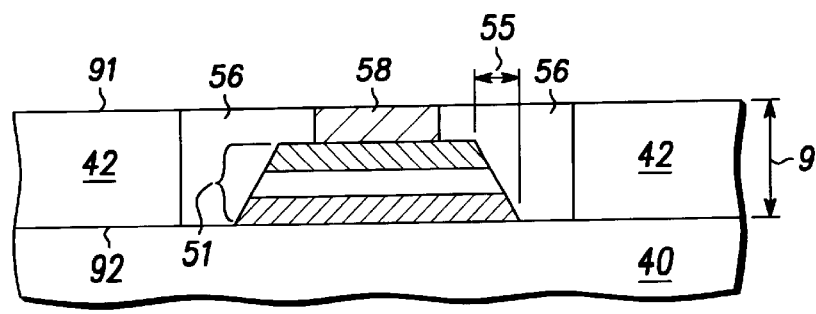

Turning now to FIG. 11, photoresist layer 46 is removed by using a technique well known to those skilled in the art. A dielectric layer 57 is then deposited on MRAM cell 39 and patterned and etched using dry etching. to form a sidewall spacer 56 and expose a portion of ferromagnetic region 54. Dielectric layer 57 can include silicon oxide (SiO$_2$), silicon nitride (Si$_3$N$_4$), or another suitable dielectric material. A conductive layer 58 is then deposited on the exposed portion of ferromagnetic region 54 and polished using CMP or the like, as illustrated in FIG. 12. It will be understood that conductive layer 58 can include copper (Cu) or another suitable conductive material.

MRAM device 51 has a taper 55 which is formed by the high aspect ratio of photoresist layer 46. The high aspect ratio of photoresist layer 46 causes the width of trench 48 at top 94 of photoresist layer 46 to decrease as MRAM device 51 is deposited wherein the width of each subsequently deposited layer 50, 52, and 54 is formed with a shorter width than the previously deposited layer. Hence, MRAM device 51 is formed with taper 55, as illustrated in FIG. 12. In the preferred embodiment, the width of trench 48 at bottom 92 of dielectric layer 42 is formed to be approximately equal to the width of trench 48 at top 91 of dielectric layer 42. Hence, dielectric layer 42 is a cavity-forming layer wherein MRAM device 51 is formed. Taper 55 decreases the likelihood of a shorting current flowing through ferromagnetic regions 50 and 54. Further, taper 55 can be oxidized with an oxygen plasma or the like to further decrease the likelihood of a shorting current.

Figure 13:
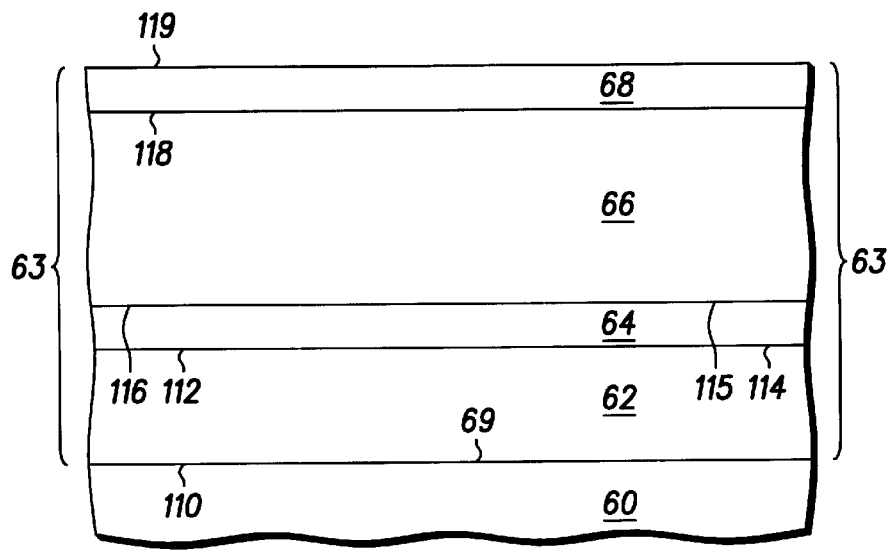
FIGS. 13 through 15 are simplified cross-sectional views illustrating several steps in another embodiment of a method of fabricating a MRAM device with a taper in accordance with the present invention wherein N is equal to four.

Turning now to FIG. 13, another embodiment of forming a MRAM cell 59 is illustrated. MRAM cell 59 includes a substrate 60 with a surface 69 whereon a dielectric region 63 is positioned. It will be understood that substrate 60 can include a conductive layer, such as copper (Cu) or another suitable conductive material. In this embodiment, N is equal to four wherein dielectric region 63 includes a dielectric layer 62 with a bottom 110 and a top 112, layer 62 being positioned on substrate 60, a dielectric layer 64 with a bottom 114 and a top 115, layer 64 being positioned on dielectric layer 62, a dielectric layer 66 with a bottom 116, layer 66 being positioned on dielectric layer 64, and a dielectric layer 68 with a bottom 118 and a top 119, layer 68 being positioned on dielectric layer 66. Further, in this embodiment, dielectric layers 62 and 66 have different etch properties than dielectric layers 64 and 68, as will be discussed presently.

Figure 14:
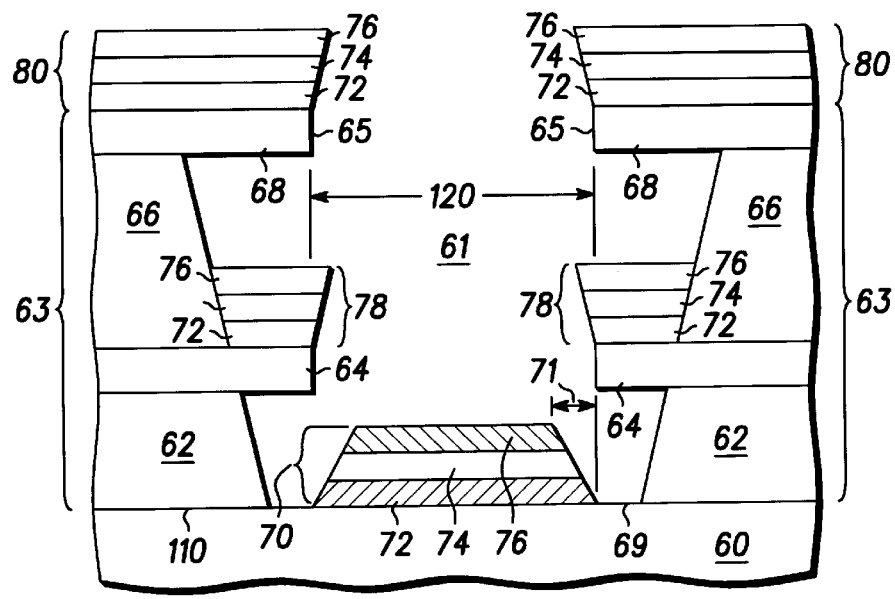

Turning now to FIG. 14, a trench 61 with a width 120 and a depth 122 is formed within dielectric region 63 wherein trench 61 has a side 65. The width of trench 61 at bottom 110 of dielectric layer 62 is etched to be less than the width of trench 61 at the top of dielectric layer 62. Further, the width of trench 61 at bottom 114 of dielectric layer 64 is etched to be less than width 120 of trench 61 at bottom 110 of dielectric layer 62. The width of trench 61 at bottom 116 of dielectric layer 66 is etched to be substantially equal to the width of trench 61 at top 112 of dielectric layer 62 and the width of the trench 61 at bottom 118 of dielectric layer 68 is etched to be approximately equal to the width of trench 61 at bottom 114 of dielectric layer 64. Hence, trench 61 is formed to have a dual overhang gap sidewall, as illustrated in FIG. 14, wherein an undercut gap is formed proximate to side 65.

Figure 15:
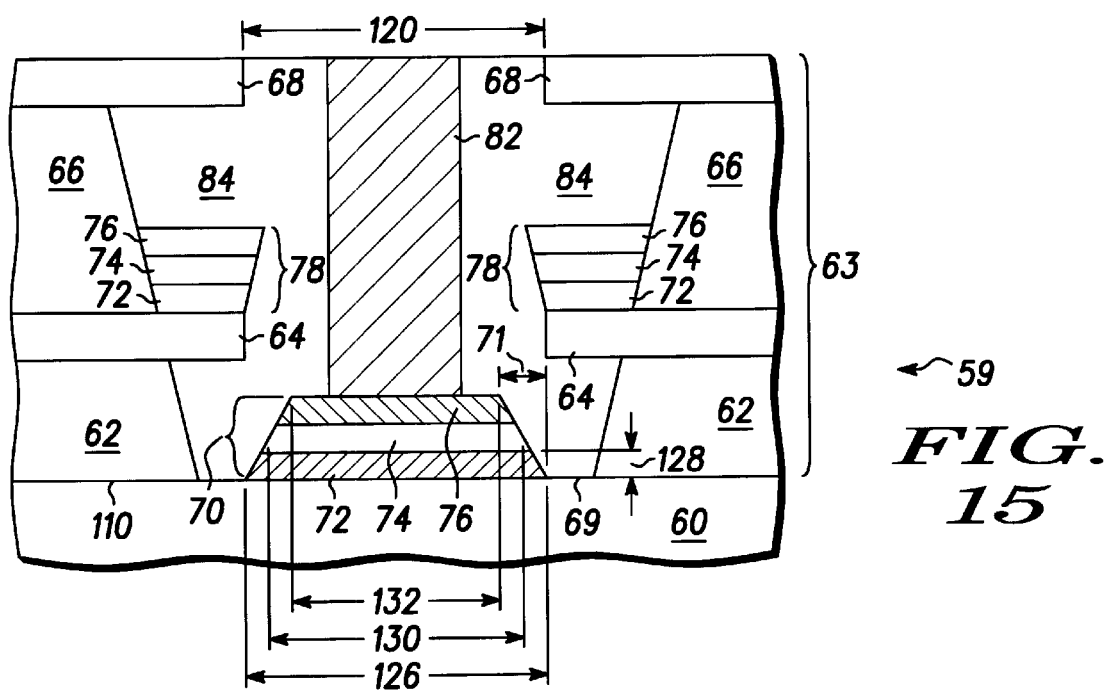

Turning now to FIG. 15, a MRAM device 70 with a surface is deposited within trench 61 and positioned on substrate 60. Further, MRAM device 70 includes a ferromagnetic region 72 with a width 126 and a thickness 128 positioned on substrate 60, a non-ferromagnetic spacer layer 74 with a width 130 positioned on ferromagnetic region 72, and a ferromagnetic region 76 with a width 132 positioned on non-ferromagnetic spacer layer 74. In the preferred embodiment, ferromagnetic region 72 includes a pinned synthetic anti-ferromagnetic region and ferromagnetic region 76 includes a free ferromagnetic region. Further, non-ferromagnetic spacer layer 74 forms a tunneling junction between ferromagnetic regions 72 and 76. It will be understood that ferromagnetic regions 72 and 76 and non-ferromagnetic spacer layer 74 can include multiple layers, but are illustrated as including one layer for simplicity.

During deposition of MRAM device 70, an unwanted blanket region 78 and 80 is typically formed on dielectric layers 64 and 68, respectively. Further, the undercut gaps formed proximate to side 65 prevents unwanted blanket regions 78 and 80 from being deposited on surface 69 adjacent to side 65 such that a gap exists between MRAM device 70 and side 65.

Unwanted blanket regions 78 and 80 cause the width of trench 61 at top 115 of dielectric layer 64 and top 119 of dielectric layer 68 to decrease as MRAM device 70 is deposited wherein the width of each subsequently deposited layer 72, 74, and 76 is formed with a shorter width than the previously deposited layer. Hence, MRAM device 70 is formed with taper 71, as illustrated in FIG. 14. Taper 71 is formed wherein width 126 of ferromagnetic region 72 is substantially greater than width 130 of non-ferromagnetic spacer layer 74. Further, width 130 of non-ferromagnetic spacer layer 74 is substantially greater than width 132 of ferromagnetic region 76. Taper 71 decreases the likelihood of a shorting current flowing through ferromagnetic regions 72 and 76. Further, taper 71 can be oxidized with an oxygen plasma or the like to further decrease the likelihood of a shorting current.

In the preferred embodiment, the undercut gaps are filled with a dielectric material 78 (FIG. 15), such as silicon oxide (SiO), silicon nitride (SiN), or another suitable dielectric material. Dielectric material 78 is etched so that the surface of MRAM device 70 is partially exposed. Dielectric material 78 can be patterned and etched by methods well known to those skilled in the art, such as wet etching, CMP, etc. A conductive material 82 is deposited on MRAM cell 59 and patterned and etched to form a conductive via positioned adjacent to MRAM device 70.

For most thin-film deposition processes the flux of depositing material has some angular distribution around the direction normal to the substrate surface. The sides of the trench block the deposition of atoms approaching at some angles which gives rise to a shadow region near the trench wall, thus creating a taper at the edge of the film near the wall. Tapers 21, 71, and 55 have a length given approximately by the equation $l=d \cdot \tan(\theta)$, where l is the length of the taper, d is the depth of the trench, and $\theta$ is the average deviation of the deposition angle from normal incidence. Hence, the length, l, can be controlled by varying l and $\theta$. The angular distribution of the flux of depositing material can be controlled by various methods depending upon the deposition technique. A typical physical vapor deposition (PVD) process, such as magnetron sputtering, gives rise to a wide distribution that creates a taper length l similar in magnitude to the depth of the trench d. A typical ion beam deposition (IBD) process or a collimated PVD process will produce a narrower distribution resulting in less taper. Although a typical IBD process provides a more collimated flux, a wider distribution at the wafer can be created by rotating the substrate during deposition with a tilt angle that places the center of the depositing material distribution substantially off normal incidence. Thus, by using an IBD process to form the layers, it is possible to create some layers with more taper than others by choosing the tilt angle as desired for each layer.

In another embodiment, a three dimensional MRAM bit can be provided wherein the pinned layer is deposited with a flux perpendicular to the surface and the free layer is deposited with a flux that has an angular distribution, so that the free layer has a thicker center. The additional volume provided by the thicker center results in improved data retention. Further, the thin edges inhibit domain bending around the edges while allowing increased free layer volume.

Thus, an improved and novel fabrication method for a magnetic memory element is disclosed. An advantage of this method is the elimination of etching steps that utilize corrosive elements, such as chlorine (Cl), which can damage the thin layers typically used in an MRAM device. Also, the MRAM device is tapered which reduces the chances of a shorting current flowing between the free ferromagnetic region and the pinned ferromagnetic region, and, consequently, increases the device yield. Also, an oxide can be formed surrounding the MRAM device to further reduce the likelihood of a shorting current.

Various changes and modifications to the embodiments herein chosen for purposes of illustration will readily occur to those skilled-in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

What is claimed is:

1. A method of fabricating a magnetoresistive random access memory device with a taper comprising:

providing a substrate with a surface;

forming a dielectric region with a surface and a bottom, the dielectric region positioned on the substrate;

patterning and etching through the dielectric region to the substrate to form a trench with a top width and a bottom width, the trench further including a side wherein an edge profile is formed on the side of the trench;

depositing the magnetoresistive random access memory device within the trench and positioned on the substrate wherein the magnetoresistive random access a memory device has a surface and a side, the device including a first ferromagnetic region with a width positioned on the substrate, a non-ferromagnetic spacer layer with a width positioned on the first ferromagnetic region, and a second ferromagnetic region with a width positioned on the non-ferromagnetic spacer layer and wherein a gap exists between the magnetoresistive random access memory device and the side of the trench;

forming the edge profile on the side of the trench such that an undesired portion of the magnetoresistive random access memory device is prevented from being deposited on the side of the trench proximate to the bottom of the dielectric region and on the surface of the substrate adjacent to the side of the trench; and depositing the magnetoresistive random access memory device wherein the taper is formed by making the width of the first ferromagnetic region greater than the width of the non-ferromagnetic spacer layer, and the width of the non-ferromagnetic spacer layer greater than the width of the second ferromagnetic region so that the first ferromagnetic region is separated from the second ferromagnetic region.

2. A method as claimed in claim 1 wherein the first ferromagnetic region includes a pinned synthetic antiferromagnetic region and the second ferromagnetic region includes a free ferromagnetic region.

3. A method as claimed in claim 1 wherein the step of depositing the non-ferromagnetic spacer layer includes a step of forming a tunneling junction between the first ferromagnetic region and the second ferromagnetic region.

4. A method as claimed in claim 1 wherein the step of forming the edge profile on the side of the trench includes forming an undercut gap on the side of the trench wherein the bottom width of the trench is substantially greater than the top width of the trench.

5. A method as claimed in claim 1 further including a step of filling the undercut gap adjacent to the side of the device with one of silicon oxide, silicon nitride, and another suitable dielectric material, wherein the surface of the magnetoresistive random access memory device is partially exposed.

6. A method as claimed in claim 5 wherein the step of filling includes etching a portion of the dielectric material to expose the surface of the magnetoresistive random access memory device.

7. A method as claimed in claim 1 further including a step of oxidizing the taper of the magnetoresistive random access memory device to prevent a shorting current from flowing through the first and second ferromagnetic regions.

8. A method as claimed in claim 1 wherein the step of depositing includes forming the second ferromagnetic region with a thicker central portion.

9. A method as claimed in claim 1 wherein the dielectric region includes N dielectric layers where N is greater than or equal to one and wherein each adjacent dielectric layer has a different etch property.

10. A method as claimed in claim 9 wherein at least one dielectric layer prevents an undesired portion of the magnetoresistive random access memory device from being deposited on the surface of the substrate adjacent to the first side and the second side of the trench.

11. A method as claimed in claim 1 wherein the top width of the trench decreases as the magnetoresistive random access memory device is deposited.

12. A method as claimed in claim 1 wherein the bottom width of the trench is greater than the width of the first ferromagnetic region.

13. A method as claimed in claim 1 wherein the taper of the magnetoresistive random access device is oxidized using one of an oxygen plasma and another suitable technique to prevent a shorting current from flowing through the first and second ferromagnetic regions.

14. A method as claimed in claim 1 wherein the second ferromagnetic region includes a pinned synthetic anti-ferromagnetic region and the first ferromagnetic region includes a free ferromagnetic region.

15. A method as claimed in claim 1 wherein the step of depositing the magnetoresistive random access memory device includes using an ion beam deposition process to distribute flux of a depositing material.

16. A method as claimed in claim 15 wherein the step of using the ion beam deposition process includes controlling the width of at least one of the regions and layers of the magnetoresistive random access memory device by varying the distribution of the flux of the depositing material.

17. A method as claimed in claim 16 wherein the step of varying the distribution of the flux of the depositing material includes using ion beam deposition with different substrate angles for different regions and layers.

18. A method as claimed in claim 1 wherein the step of depositing the magnetoresistive random access memory device includes using a physical vapor deposition process with a collimated beam to distribute flux of a depositing material.

19. A method as claimed in claim 18 wherein the step of using a physical vapor deposition process with a collimated beam includes using the collimated beam with different amounts of collimation for different regions and layers.

20. A method of fabricating a magnetoresistive random access memory device with a taper comprising:

providing a substrate with a surface;

forming a dielectric region with a bottom, the dielectric region positioned on the substrate;

patterning and etching through the dielectric region to the substrate to form a trench with a top width and a bottom width within the dielectric region, the trench including a side wherein an edge profile is formed on the side of the trench;

depositing a magnetoresistive random access memory device within the trench and positioned on the substrate wherein the tapered magnetoresistive random access memory device has a surface, the device including a first ferromagnetic region with a width and a thickness positioned on the substrate, a non-ferromagnetic spacer layer with a width positioned on the first ferromagnetic region, and a second ferromagnetic region with a width positioned on the non-ferromagnetic spacer layer and wherein a gap exists between the tapered magnetoresistive random access memory device and the side of the trench; and depositing the tapered magnetoresistive random access memory device wherein the taper is formed by making the width of the first ferromagnetic region substantially greater than the width of the non-ferromagnetic spacer layer, and the width of the non-ferromagnetic spacer layer substantially greater than the width of the second ferromagnetic region.

21. A method as claimed in claim 20 wherein the first ferromagnetic region includes a pinned synthetic anti-ferromagnetic region and the second ferromagnetic region includes a free ferromagnetic region.

22. A method as claimed in claim 20 wherein the step of depositing the non-ferromagnetic spacer layer includes a step of forming a tunneling junction between the first ferromagnetic region and the second ferromagnetic region.

23. A method as claimed in claim 20 wherein the step of forming the edge profile on the side of the trench includes forming an undercut gap on the side of the trench wherein the bottom width of the trench is substantially greater than the top width of the trench.

24. A method as claimed in claim 23 further including a step of filling the undercut gap with one of silicon oxide, silicon nitride, and another suitable dielectric material, wherein the surface of the tapered magnetoresistive random access memory device is partially exposed.

25. A method as claimed in claim 20 wherein the dielectric region includes N dielectric layers where N is greater than or equal to one and wherein each adjacent dielectric layer has a different etch property.

26. A method as claimed in claim 25 wherein N is equal to two where the dielectric region includes a first dielectric layer with a thickness, a top, and a bottom positioned on the substrate and wherein the dielectric region further includes a second dielectric layer with a top and a bottom positioned on the first dielectric layer.

27. A method as claimed in claim 26 wherein the step of etching the dielectric region includes forming the width of the trench at the bottom of the first dielectric layer to be approximately equal to the width of the trench at the top of the first dielectric layer.

28. A method as claimed in claim 27 wherein the step of etching the dielectric region includes forming the width of the trench at the bottom of the second dielectric layer to be less than the width of the trench at the bottom of the first dielectric layer wherein an undercut gap is formed on the side of the trench.

29. A method as claimed in claim 28 wherein the step of etching the dielectric region includes forming the width of the trench at the top of the second dielectric layer to be greater than the width of the trench at the bottom of the second dielectric layer.

30. A method as claimed in claim 29 further including a step of filling the undercut gap with one of silicon oxide, silicon nitride, and another suitable dielectric material, wherein the surface of the tapered magnetoresistive random access memory device is partially exposed.

31. A method as claimed in claim 28 wherein the thickness of the first ferromagnetic layer is approximately equal to the thickness of the first dielectric layer.

32. A method as claimed in claim 31 further including a step of filling the undercut gap with one of silicon oxide, silicon nitride, and another suitable dielectric material, wherein the surface of the tapered magnetoresistive random access memory device is partially exposed.

33. A method as claimed in claim 25 wherein N is equal to two where the dielectric region includes a dielectric layer with a thickness positioned on the substrate and wherein the dielectric region further includes a photoresist layer with a thickness positioned on the dielectric layer.

34. A method as claimed in claim 33 wherein the thickness of the photoresist layer is substantially greater than the thickness of the dielectric layer so that the trench has an aspect ratio that prevents the tapered magnetoresistive random access memory device from being deposited on the side of the trench proximate to the bottom of the dielectric region and on the surface of the substrate adjacent to the first and second sides of the trench.

35. A method as claimed in claim 25 wherein N is equal to four where the dielectric region includes a first dielectric layer with a top and a bottom positioned on the substrate, a second dielectric layer with a bottom positioned on the first dielectric layer, a third dielectric layer with a bottom positioned on the second dielectric layer, and a fourth dielectric layer with a bottom positioned on the third dielectric layer.

36. A method as claimed in claim 33 wherein the first and the third dielectric layers have different etch properties than the second and the fourth dielectric layers.

37. A method as claimed in claim 36 wherein the step of etching the dielectric region includes forming the width of the trench at the bottom of the first dielectric layer to be less than the width of the trench at the top of the first dielectric layer.

38. A method as claimed in claim 37 wherein the step of etching the dielectric region includes the step of forming the width of the trench at the bottom of the second dielectric layer to be less than the width of the trench at the bottom of the first dielectric layer.

39. A method as claimed in claim 38 wherein the step of etching the dielectric region includes forming the width of the trench at the bottom of the third dielectric layer to be substantially equal to the width of the trench at the top of the first dielectric layer.

40. A method as claimed in claim 39 wherein the step of etching the dielectric region includes the step of forming the width of the trench at the bottom of the fourth dielectric layer to be substantially equal to the width of the trench at the bottom of the second dielectric layer.

41. A method as claimed in claim 40 further including a step of positioning a dielectric layer adjacent to the side of the trench to form a sidewall spacer layer wherein a portion of the surface of the tapered magnetoresistive random access memory device is exposed.

42. A method as claimed in claim 41 wherein the sidewall spacer layer includes one of silicon oxide, silicon nitride, and other suitable dielectric materials.

43. A method as claimed in claim 20 further including a step of oxidizing the taper of the magnetoresistive random access device using one of an oxygen plasma and another suitable technique to prevent a shorting current from flowing through the first and second ferromagnetic regions.

44. A method as claimed in claim 20 wherein the second ferromagnetic region includes a pinned synthetic antiferromagnetic region and the first ferromagnetic region includes a free ferromagnetic region.

* * * * *

UNITED STATES PATENT AND TRADEMARK OFFICE
CERTIFICATE OF CORRECTION

PATENT NO. : 6,518,071 B1
DATED : February 11, 2003
INVENTOR(S) : Durlam et al.

It is certified that error appears in the above-identified patent and that said Letters Patent is hereby corrected as shown below:

<u>Column 1,</u>
Line 4, after the Title, please add as a new first paragraph the following paragraph:
 -- This invention was made with Government support under Agreement No. MDA972-96-3-0016 awarded by DARPA. The Government has certain rights in the invention. --

Signed and Sealed this

Nineteenth Day of August, 2003

JAMES E. ROGAN
*Director of the United States Patent and Trademark Office*